United States Patent [19]

Aupperle

[11] Patent Number: 4,659,281

[45] Date of Patent: Apr. 21, 1987

[54] LOADING AND UNLOADING SYSTEM FOR PIECE PART CARRIER

[75] Inventor: Donald P. Aupperle, Seattle, Wash.

[73] Assignee: Robbins & Craig Welding & Manufacturing Co., South El Monte, Calif.

[21] Appl. No.: 743,696

[22] Filed: Jun. 10, 1985

[51] Int. Cl.$^4$ ............................................. B65G 47/02
[52] U.S. Cl. .................................. 414/787; 198/346.1; 198/346.2; 198/465.3; 414/27; 414/416; 414/908
[58] Field of Search ................. 414/27, 416, 787, 908, 414/911, 684; 198/346.2, 346.1, 465.1, 465.3, 803.01, 803.12, 803.2, 468.2, 468.6, 681

[56] References Cited

U.S. PATENT DOCUMENTS

| | | | |
|---|---|---|---|
| 2,802,586 | 8/1957 | Wingard | 198/468.6 |
| 2,965,214 | 12/1960 | Schlumpf et al. | 198/465.3 |
| 3,033,342 | 5/1962 | Kinnicutt, Jr. | 198/803.12 X |
| 3,702,138 | 11/1972 | Abrahamsson et al. | 198/431 X |
| 3,999,665 | 12/1976 | Rogers | 414/911 X |
| 4,153,211 | 5/1979 | Lenk et al. | 414/911 X |
| 4,290,734 | 9/1981 | Van Breen | 414/787 X |
| 4,361,221 | 11/1982 | Michal | 198/465.3 X |
| 4,456,417 | 6/1984 | Gerding | 414/27 X |

FOREIGN PATENT DOCUMENTS 1231314   5/1971   United Kingdom ................ 414/416

*Primary Examiner*—Robert J. Spar
*Assistant Examiner*—Stuart J. Millman
*Attorney, Agent, or Firm*—Price, Gess & Ubell

[57] ABSTRACT

A "hands-free" apparatus for loading and unloading piece parts from baskets containing a plurality of such parts on a ferris wheel or other type carrier for submersion into plating or cleaning tanks. The preferred embodiment is adapted for handling plurality of metallic disks to be plated for the purpose of magnetic recording of data. The system accepts a plurality of baskets transported to it on a conveyor mechanism. The baskets are simultaneously lifted up to a load/unload position at which a mandrel is threaded through the aperture in each metallic disk. The baskets are lowered back down to the conveyor. The mandrel carrying the disks is swung onto a slot on the ferris wheel which is adapted to carry approximately twelve such disk carrying mandrels. The ferris wheel is stepped to the next slot which is loaded the same way. After all slots on the ferris wheel are loaded, the entire ferris wheel is removed from engagement with the loader and transported through the fabrication cycle. Each disk is worked on while resting in its notch on its mandrel in a specific slot on a particular ferris wheel. During the manufacturing process, the mandrel is rotated, causing each disk to rotate, at the same time that the entire ferris wheel is being rotated. After the manufacturing cycle is complete, the ferris wheel is brought back into engagement with the loader/unloader. The completed disks are placed back into their baskets in a sequence that is the reverse of the loading sequence. The loaded baskets are transported away by the conveyor system.

11 Claims, 11 Drawing Figures

FIG. 3
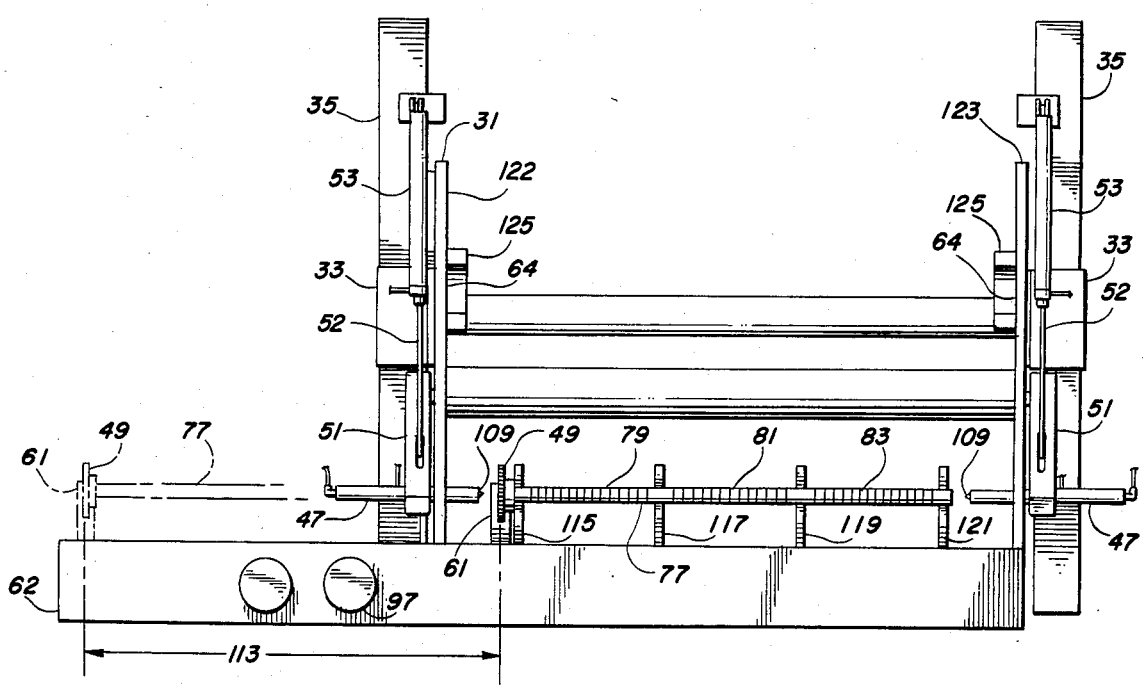
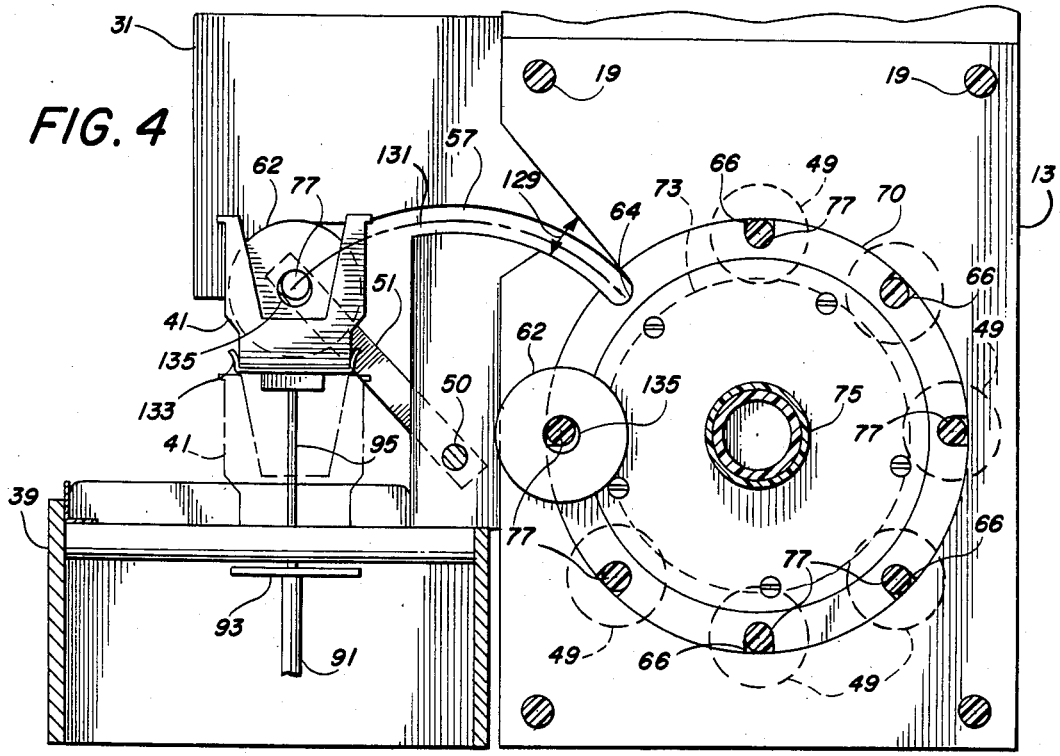
FIG. 4

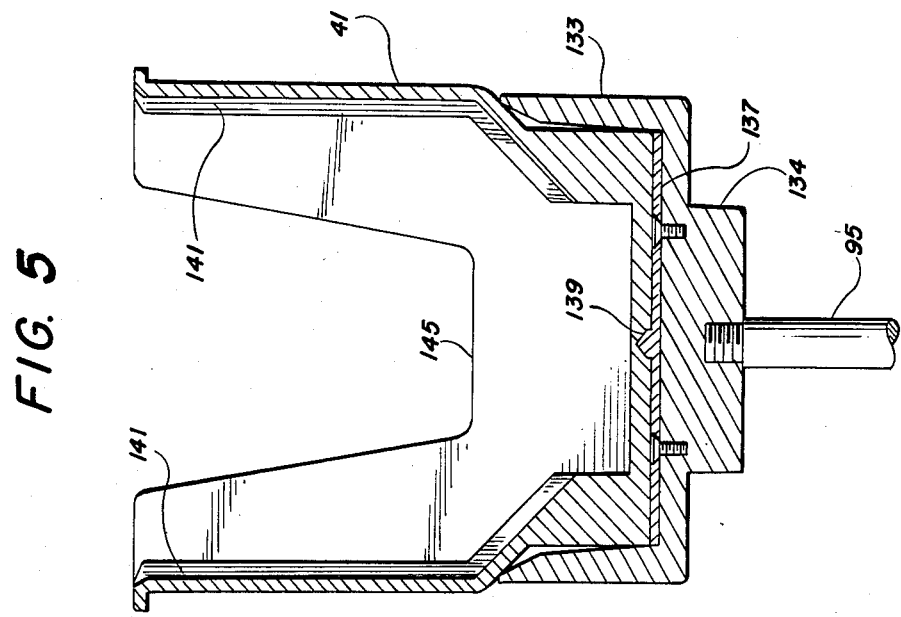
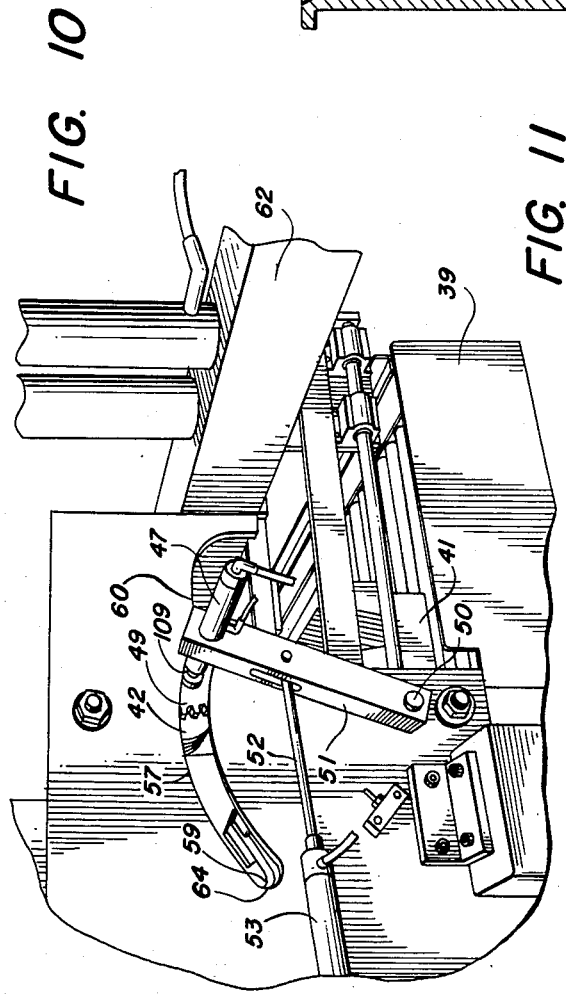
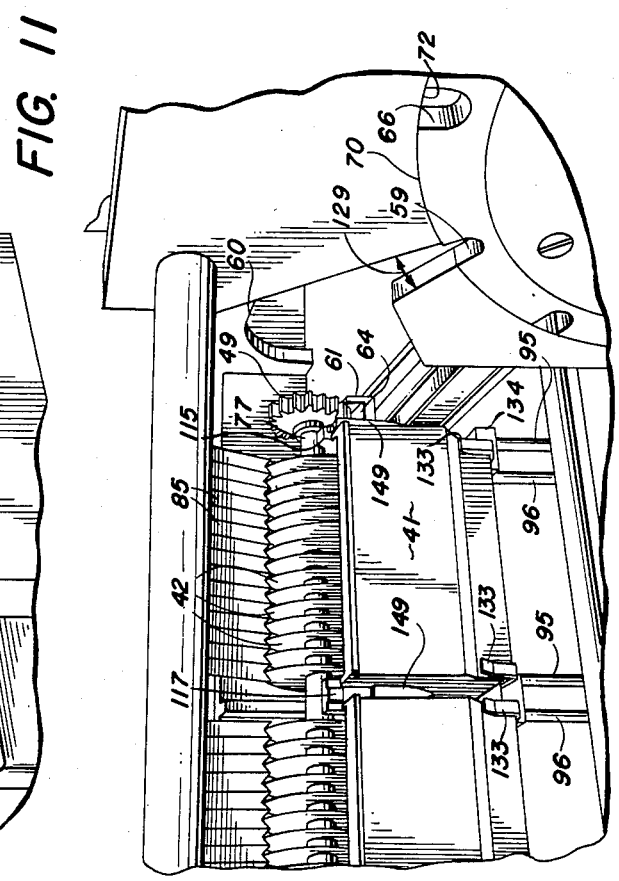

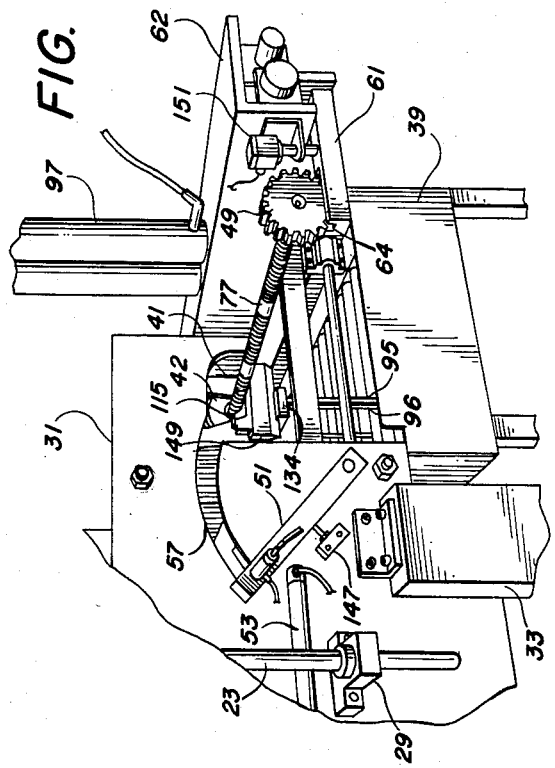
FIG. 7
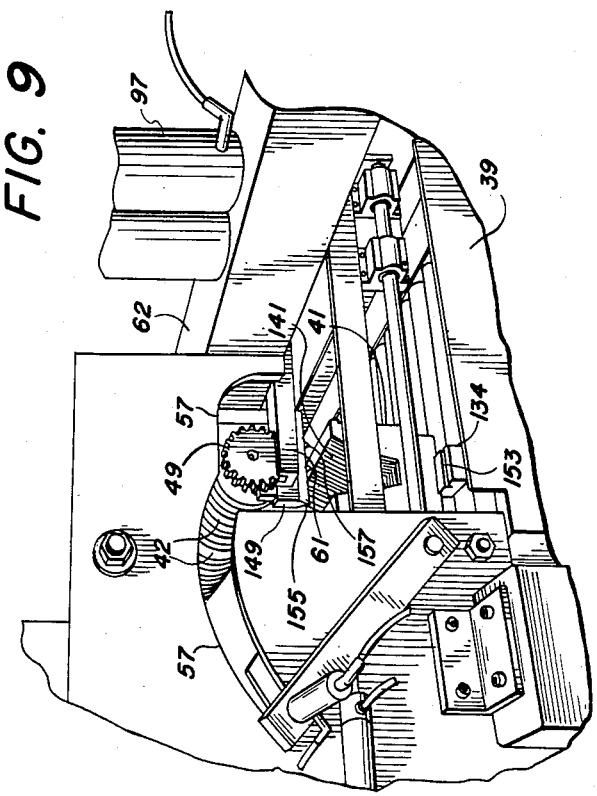
FIG. 9
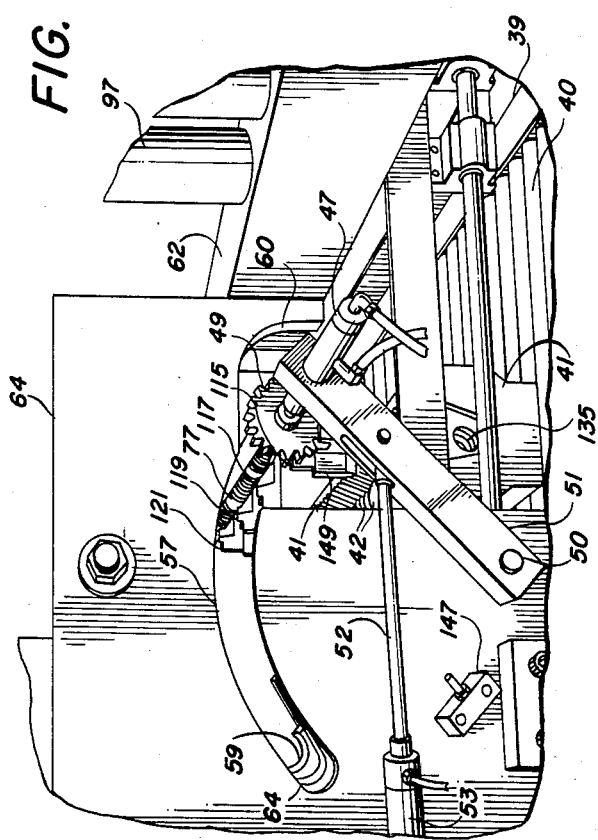
FIG. 6
FIG. 8

4,659,281

LOADING AND UNLOADING SYSTEM FOR PIECE PART CARRIER

BACKGROUND OF THE INVENTION

1. Field of the Invention

The present invention relates to a system for loading or unloading parts to be treated into/from a rack which carries the parts through the treating process and more particularly, pertains to a system for loading or unloading metallic disks into/from a ferris wheel rack for carrying the disks through a plating process whereby the disks are plated with metals that permit recording of data on such disks.

2. Description of the Prior Art

In the field of electronic parts plating, those concerned with the automation of the plating process have long recognized the need for eliminating human handling of the piece parts to be treated to the greatest extent possible. Reduction of human handling in this type of manufacturing process can be directly related to reduction of quality control rejections of the final product. The present invention eliminates manual handling of parts in a critical portion of the manufacturing process for disks used to record data in computers. The result of the invention is a direct increase in the number of final products accepted by quality control.

SUMMARY OF THE INVENTION

The general purpose of this invention is to provide for the loading and unloading of piece parts carried in a ferris wheel or fixed mandrel location type carrier through a manufacturing process. The unique interrelationship of the carrier and the loader/unloader make this invention possible. The mandrels by which the piece parts are carried in the ferris wheel carrier are smoothly and in turn, removed from their respective slots on the ferris wheel. As each mandrel is removed from its slot, it is moved to the load/unload point and actuated to pick up a plurality of piece parts. After being loaded with the piece part, the mandrel is then loaded back into its respective slot in the ferris wheel. The ferris wheel is stepped to its next slot. The process is repeated. The reverse sequence occurs when the ferris wheel is being unloaded of its finished product. The ferris wheel is designed to be an integral part of the loader/unloader mechanism and also be able to withstand and function in the manufacturing environment the piece parts must undergo. The ferris wheel carrier turns each mandrel with its piece parts and also rotates about its own axis, moving all the mandrels and piece parts in a larger circle.

BRIEF DESCRIPTION OF THE DRAWINGS

The objects and many of the attendant advantages of this invention will be readily appreciated as the same becomes better understood by reference to the following detailed description, when considered in conjunction with the accompanying drawings, in which like reference numerals designate like parts throughout the figures and wherein:

FIG. 3 is a top view of the loading/unloading apparatus with the ferris wheel mechanism removed.

FIG. 4 is a side elevation partly in section of the preferred embodiment shown in FIG. 2 along 4—4.

FIG. 5 is a sectional view of the basket and shoe for the basket which is a component part of the apparatus.

FIG. 6 is a perspective of part of the loading/unloading apparatus looking from the side shown in FIG. 1.

FIG. 7 is a perspective of part of the loading/unloading apparatus looking from the side shown in FIG. 1.

FIG. 8 is a perspective of part of the loading/unloading apparatus looking from the side shown in FIG. 1.

FIG. 9 is a perspective of part of the loading/unloading apparatus looking from the back shown in FIG. 2.

FIG. 10 is a perspective of part of the loading/unloading apparatus looking from the side shown in FIG. 1.

FIG. 11 is a perspective of part of the loading/unloading apparatus looking from the side shown in FIG. 1.

DESCRIPTION OF THE PREFERRED EMBODIMENTS

Figure 1:
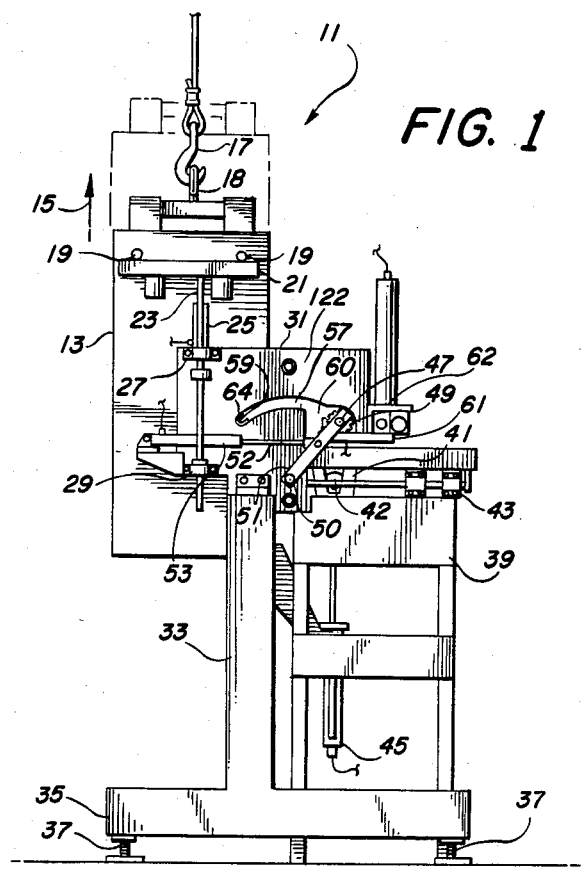
FIG. 1 is a side elevation of a perferred embodiment of the invention with all component parts.
Figure 2:
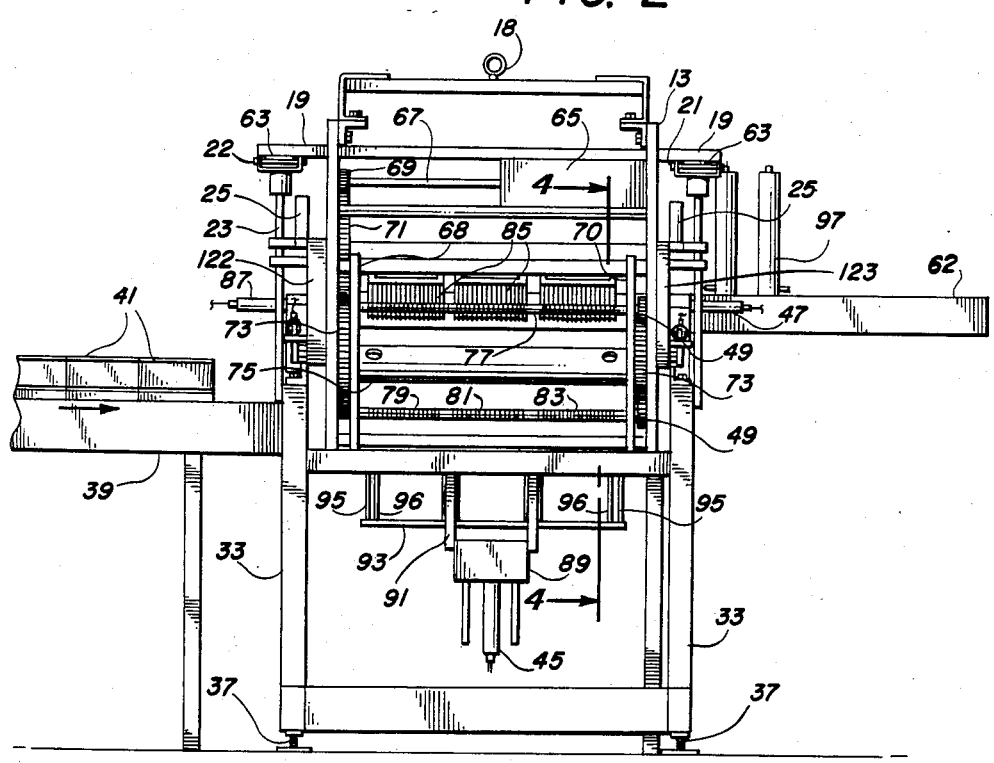
FIG. 2 is a back view of the preferred embodiment of the invention shown in FIG. 1, looking left to right.

Referring first to FIGS. 1 and 2, a preferred embodiment 11 of the loading and unloading apparatus for piece part carrier is illustrated. The entire apparatus for loading and unloading of piece parts, such as disks 42 with apertures in their center, for example, comprises basically three major components: a ferris wheel mechanism 13; a loading/unloading mechanism 31; and a conveyor system 39 which conveys the baskets 41 containing the disks 42 therein to the loading/unloading mechanism 31.

The loader/unloader 31 has a frame, including side plates 122 and 123, each side having an arcuate slot 57 therein terminating at the rear end 64 in a U-shape and at the front end 60 in a large opening. Slot 57 may have any other configuration. The loader/unloader frame 31 is supported by a pair of upstanding legs 33 having a T-shaped bottom 35 with leveling adjustments 37.

The conveyor system 39 which could, for example, be a roller type conveyor system, well-known in the art, sits underneath and in an overlapping manner with the loader/unloader 31 frame at the front cutout 60. The arms 51 of the loader/unloader, when located at their extreme of travel in the front direction 60 overlies a portion of the conveyor 39. All mechanical movement of components within the loader/unloader may be actuated by means of pneumatic or hydraulic cylinders, mechanical actuators, or by hand operation. Hereinafter, all actuators are referred to as hydraulic.

The ferris wheel racking mechanism 13 fits within the side plates 122 and 123 of the frame of the loader/unloader 31. Support beams 19 passed through the frame of the ferris wheel mechanism at the top and rest upon support bars 21 which are attached to upstanding beams 23. Beams 23 are held to the sides 122 and 123 of the loader/unloader by lateral bearing mechanisms 27 and 29, allowing the support beam bar 23 to move up and down to a limited extent. This up and down movement is damped by hydraulic mechanisms 25 also attached to the beams 23 and the sides 122 and 123 of the loader/unloader 31.

The ferris wheel racking mechanism 13 is removable from the rest of the loader/unloader mechanism by means of a crane. A crane would move the ferris wheel mechanism 13 in an upwardly direction 15 lifting it out of engagement with the loader/unloader 31. Specifically, this lifting motion would unseat a pair of boss members 59 which rest in respective saddles 125 (FIG.

3), one on each of the sides 122 and 123 of the loader/unloader 13. The specific arrangement of the saddles and boss members will be explained more fully hereinafter.

The ferris wheel mechanism 13, when removed from the loader/unloader 31, can be carried to and through the manufacturing or processing area which, for example, could be a plurality of plating stations in a plating line. The ferris wheel mechanism 13 would mechanically or automatically be removed from one plating station to another, being immersed in the plating or cleaning solutions as required, while carrying the particular piece parts that are to be plated. The manner in which the ferris wheel mechanism 13 carries these piece parts and provides for an even plating of each one will be more fully explained hereinafter.

If the apparatus of the FIGS. 1 and 2 were performing a loading function, for example, the ferris wheel mechanism 13 would be brought empty to the loader/unloader 31, placed on the support bars 21 by downward motion centering into the saddle seats 125 (FIG. 3) by lateral motion. This lateral motion is permitted by a plurality of laterally moving pads 63 mounted within the support bars 21. The support bars 21 and 22 support the weight of the ferris wheel mechanism 13. The saddle seats 125 and 127 simply locate the boss member 59 extending outwardly from the sides of the frame of the ferris wheel mechanism 13 with respect to the end 64 of the arcuate slot 57 on the sides 122 and 123 of the loader/unloader mechanism 31. As will be more fully explained hereinafter, the location of the bosses 59 at the end 64 of the arcuate slots 57 is necessary to facilitate loading of the ferris wheel mechanism 13 by the hydraulically driven arms 51.

The arms 51 pivot about a common axis 50 as a result of piston 52 of hydraulic cylinder 53 moving laterally towards and away from the conveyor mechanism 39. The cylinder 53 is actuated in a manner well known in the art by compressed air. Whenever shaft 52 moves, it causes the arm 52 and, specifically, the pneumatically driven finger 47 of arm 51 to trace an arcuate path from the front 60 to the back 64 and vice versa. This motion of the arm 51 with its pneumatic fingers 47, transports a mandrel 77 having a gear 49 at one end thereof, either in a loaded or unloaded condition. In the position shown in FIG. 1, the mandrel 77 is being placed in a loading position at the front end 60 of the loader/unloader 31.

Each mandrel 77 has a plurality of circular grooved sections 79, 81 and 83, along its shaft adapted to receive a single disk 42 in each of the grooves of the shaft. Exactly how this loading of the disks on the shaft of the mandrel 77 is accomplished with be explained hereinafter.

A third mechanical arm 61 is located at the loading position of the front end 60 of the arcuate slot 57. The arm 61 has a slot 64 therein (FIG. 7) which receives the gear 49 and grasps it so as to restrain its lateral movement, which would be in and out of the paper in FIG. 1 and movement left to right or right to left in FIG. 2. The third mechanical arm 61 is hydraulically driven along a slide and support member 62 in a manner, and for a purpose which will be explained hereinafter.

The baskets 41 loaded with the disks 42 having apertures through their geometric centers are brought into position by the conveyor mechanism 39 underneath the area where a mandrel 77 is located by the mechanical arms 51 at the front end 60 of the arcuate slot 57 for loading purposes. The baskets 41 are raised by a hydraulic mechanism having a guide mechanism 89 which is connected to a plate support member 93, that in turn, has mounted thereon upstanding rod pairs 95 and 96. The rod pairs 95 and 96 have connected thereto, basket shoes which engage the bottom of the baskets located on the conveyor mechanism as will be more fully explained hereinafter. The shoes are raised up between the rollers 40 (FIG. 6) of the conveyor.

The ferris wheel racking system 13 includes a pair of rotating wheels 68 and 70 mounted on a central shaft 75 that serves as the rotation axis. Both wheels are connected to planetary gears 73 which in turn, are connected to a gear 71 that engages a gear 69 attached to the drive shaft 67 of an electrical motor 65. Applying power to motor 65 causes the wheel pairs 68 and 70 of the ferris wheel to rotate about its shaft 75.

The mandrels 77, having gears 49 at one end thereof, are placed in their slots 66 (FIG. 4) along the circumference of the wheels 68 and 70, causing the gears 49 on the mandrels to engage planetary gear 73. In this manner, the mandrels themselves turn about the axis shaft 77 as the wheels 68 and 70 turn about their axis 75.

A plurality of flexible fingers 85 are located above the load position of mandrel 77, as shown in FIG. 2. These fingers 85 are grouped in a one-to-one correspondence with the disks in the baskets that are to be loaded onto a mandrel. These fingers act to insure that the disks in the baskets are in an upstanding position for loading.

During the loading and unloading operation, as will be hereinafter explained, the pair of wheels 68 and 70 of the ferris wheel mechanism 13 must be firmly held in its "home" position. Hydraulic finger 87 physically pins wheel 68 by engaging an aperture therein through the side 122 of the loader/unloader 31.

Referring now to FIGS. 3 and 4, the structural aspects of the mandrel loading location at the front end 60 of arcuate slot 57 and the ferris load/unload location at the back end 64 of arcuate slot 57 will be discussed. FIG. 3 more clearly shows the mandrel load/unload location. FIG. 4 more clearly shows the ferris wheel load/unload location.

In the mandrel load/unload location, the mandrel 77 having its sections 79, 81 and 83 with circumferential slots thereabout, lies in a plane along a plurality of bearing surfaces 115, 117, 119 and 121 that lie along a common axis. The gear 49 attached to one end of the shaft of the mandrel 77, rests in the confines of mechanical arm 61. Arm 61 moves along a shaft propelled by a pneumatic mechanism. Cylinder 97 comprise the air supply for such a pneumatic mechanism.

The pneumatic arms 51 are shown located in the mandrel 77 load position. In other words, the shafts 52 driven by pneumatic cylinders 53 are in their fully extended position. The pneumatic fingers 47 located at the ends of the mechanical arms 51, are shown in their release location whereby the tips 109 of the fingers do not engage the ends of the mandrel 77.

The next phase of the loading operation occurs with the mechanical arms being pulled back towards the other end 64 of the arcuate slot (not shown). Once the mechanical arms 51 are out of the way, the third mechanical arm 61, which is grasping gear 49 at the end of the mandrel 77, is actuated causing it to move towards the left in the direction 113 along the shaft (not shown) of support member 62 until it reaches an end location shown in phantom at the extreme of travel as indicated by 113. When the arm 61, grasping gear 49 is at this extreme of travel at 113 (extreme left), the other end of the mandrel 77 is resting on bearing surface 115 in a manner which does not extend into the area between bearing surface 115 and 117.

When the mandrel is so located, the basket of disks on the conveyor system 39 below the mandrel, is then able to be raised to a height that will cause the geometric centers 135 of disks 62, which are all aligned on a common axis, to align with the axis of travel of mandrel 77 when located on bearing surfaces 115, 117, 119 and 121.

The following is more specifically shown in FIG. 4. The basket 41 is raised to a level wherein the central aperture 135 of disk 62 aligns with the central axis of rotation of mandrel 77 when located on the bearings 115, 117, 119 and 121. The basket is raised by means of shoe 133 which is attached to shafts 95, 96 which are in turn, attached to piston driven shaft 91. The basket 41 is raised from the conveyor 39. After the baskets are raised and held in position, the third mechanical arm 61 slides mandrel 77 back (towards the right, FIG. 3) along bearings 115, 117, 119 and 121, thereby sliding through each and every one of the central apertures of disks 62, without touching any of the disks.

Each of the three spaces between bearings 115 and 117, bearings 117 and 119, and bearings 119 and 121 are filed with a basket containing a plurality of disks. Each disk is aligned with a circumferential groove on the shaft in its respective area 79, 81 or 83 of the mandrel shaft 77. After the mandrel shaft is slid all the way through the central apertures 135 of the disks 62, the baskets are lowered back to the surface of the conveyor 39. This readies the loading of the ferris wheel with a mandrel carrying a plurality of disks. This entire operation will be explained in more detail in connection with the figures to follow.

The loading of the ferris wheel mechanism 13 with a full or empty mandrel, is accomplished by moving mechanical arms 51 to the end 64 of the arcuate slot. The end 64 of arcuate slot 57 coincides with a slot pair 66 on the pair of wheels 70 and 68 of the ferris wheel when it is aligned in its home posiiton. The sides of ferris wheel 13 are cut out at an angle as indicated at 129 to permit placing of the ends of the mandrel 77 in slot 66 when it is located at its home position which coincides with the end 64 of arcuate slot 57. During this operation, the wheels 70 and 68 are held so as to prevent any physical movement.

A planetary gear pair 73 is also attached to the shaft 75 on which the wheel 70 is attached. As the mandrels are placed in the slots, specifically the slots on wheel 70 which is at the end of the mandrel having gears 49 thereon, gears 49 engage the planetary gear 73. Rubber friction collars on the fingers 109 prevent rotation of the mandrel as it is transferred out of and into the ferris wheel to insure proper engagement of the planet and sun gear teeth. As the wheel 70 rotates with the mandrel contained in its slot 66 away from the home position 64, the ends of the mandrel are captured in slot 66.

The disks 62 ride on the mandrels 77 with their apertures 135 resting in its respective circumferential groove on the mandrel 77. As a result of the engagement of mandrel gear 49 with planetary gear 73, as wheel 70 and 73 turn in unison on shaft 75, mandrel 77 turns around its axis. The weight of disk 62 will cause it to turn with the turning of mandrel 77. As a result, each disk 62 moves in a circular path defined by the circumference of wheels 70, 68, while at the same time, rotating about the axis of mandrel 77 on which it rides.

Referring now FIG. 5, a detailed look at the baskets 41 and show 133 is illustrated. The baskets 41 are preferably made out of a sturdy rigid plastic material manufactured with a plurality of slots 141 in spaced apart relation, extending from one end of the basket to the other. Each end of the basket is cut to a depth 145 that permits total exposure of the centrally located aperture of the disks to be carried by the basket 41. The basket is supported during the lifting process by a shoe 133 which engages the basket at the bottom of both ends thereof. The shoe has a pin 139 therein, which engages a complementing location hole in the base of the basket 41 so as to accurately locate the basket on the shoe 133. Each shoe is connected to a plurality of upstanding support rods 95 and 96 by way of a block 134. The support rods are hydraulically actuated to move the shoes 133 up and down.

Referring now to FIGS. 6, 7, 8, 9, 10 and 11, a load sequence for the mandrel 77 is illustrated. The reverse of the operation show in these figures could be the mandrel unloading sequence. It should also be remembered that the mandrel loading operation is followed by a ferris wheel load operation, and a ferris unloading operation is followed by a mandrel unloading operation. Assuming now that the purpose of the loader/unloader of the present invention is to load the ferris wheel apparatus 13 with a plurality of disks to be plated, the sequence begins with a ferris wheel mechanism 13 being placed into the loader/unloader 31 so that bosses 59 rest on saddle bearings 125. The wheels of the ferris wheel mechanism are then stepped by motor 65 so that one of the slots 66 on the circumference of the wheels coincides with the home position which also happens to be the end 64 of the arcuate slot 57 in the end plates 122, 123 of the loader/unloader 31. In this location, the mandrel 77 is free to be removed by mechanical arms 51.

FIG. 6 shows the mechanical arms 51 grasping a mandrel 77 by its ends with gear 49 located at one end thereof, and placing the mandrel 77 on the bearings 115, 117, 119 and 121, which are carried by support blocks 149. The movement of the mandrel 77 from one extreme end of travel 64 of slot 57 to the other extreme end of travel 60, was occasioned by the arrival of three baskets 41 at a location below the bearing blocks 149. The arrival of the baskets at this location are sensed by well known sensors. The utilizing of these devices being well understood, the explanation of same will be dispensed with for the purposes of clarity and simplicity.

As the mandrel 77 is placed in the location shown in FIG. 6, a gear 49 is placed on the third mechanical arm 61 which has a slot 64 therein that traps gear 49. The next step is for mechanical arms 51 to release mandrel 49 and return to the other extreme of travel 64 of arcuate slot 57. The location of mechanical arms 51 at this other extreme of travel 64, is sensed by switch 147. Upon arms 51 reaching this location, the baskets 41 with the disks therein, are raised by the hydraulic mechanism attached to upstanding support rods 95 and 96.

FIG. 7 shows the baskets raised to a point where support blocks 149 for bearing surface 115, for example, engage and interact with support block 134 for the shoe 133. It, of course, must be remembered that prior to baskets 41 being raised to the position shown in FIG. 7, mandrel 77 must be moved out of the way. This is accomplished by the third mechanical arm 61 which moves to the extreme of travel shown in FIG. 7. Its arrival at this location is indicated by a proximity sensor 151. FIG. 7 illustrates the baskets raised and mandrel 77 ready for insertion into centrally located apertures 135 of the disks 42 located in the baskets.

This is accomplished by mechanical arm 61 moving toward the disks, as shown in FIG. 8. Mechanical arm 61, as it moves in the direction of the baskets, simply slides the mandrel 77 along the bearings 115, 117, 119, and 121 without touching the disks until full insertion is accomplished, as shown in FIG. 9.

FIG. 9 is a view of the baskets and disks held on the mandrel 77, looking from the ferris wheel mechanism. FIG. 9 illustrates the full insertion of mandrel 77 along its bearings 115, 117, 119 and 121 (not shown). FIG. 9 also shows the start of the sequence of lowering the baskets 41 back down to the surface of the conveyor system 39. The slotted fingers 85 come into contact with the disks 42 sitting on the mandrel 77 in their respective circumferential slots on the mandrel shaft. The purpose of fingers 85 is to keep each disk in an upright position at all times.

FIG. 9 shows the baskets lowered to the surface of the conveyor 39. It also illustrates the interaction between the support block 149 of the bearing surfaces, and the support block 134 of the basket shoe. Besides being V-shaped at its bottom 155, the support block 149 has a pair of pin 157 which engage apertures (not shown) in a complementing V-shaped receive groove 153 in the support block 134 of the basket shoe.

After the baskets 41 have been lowered, the next step is to load the mandrel carrying the disks into the ferris wheel mechanism (FIG. 10). This is accomplished by mechanical arms 51 moving from one extreme of travel 64 to the other extreme of travel 60 within arcuate slot 57, grasping the ends of mandrel 77 by its fingers 109, and moving the mandrel along arcuate slot 57 until it comes back to the extreme of travel 64. Extreme of travel 64 coincides with a slot 66 pair on the circumference of the pair of wheels 70 and 68 of the ferris wheel mechanism. Releasing the fingers 47 on the mechanical arms leaves the loaded mandrel in the slott 66 at the home position.

Having thus loaded one mandrel with disks into the ferris wheel mechanism, the ferris wheel mechanism is stepped to the next slot 66 on its circumference, and the entire cycle is repeated. In other words, the arms pick up the empty mandrel, bring it over to the bearings, withdraw the mandrel along the bearings to permit the baskets with disks to be raised into position, insert the mandrel along the bearing surfaces into the central apertures of the disks, lower the baskets, pick up the mandrel loaded with the disks and move it into the slot from which the mandrel was first taken, step to the next slot on the circumference of the wheel pair 68 and 70 of the ferris wheel mechanism 13.

The control of this sequence as well as the unload sequence can be accomplished in different well known ways, including human control of the hydraulic systems involved, or manual actuation of each manner motion. The preferred manner of controlling the sequence, however, is automatically by way of a controller, which are well known in the art and are not a part of the invention described herein.

What has been described relates to preferred embodiment of the invention and it should be remembered that modifications may be made therein, without departing from the spirit and the scope of the invention as set forth in the appended claims.

Having thus described the invention, what is claimed is:

1. Loading and unloading apparatus for a piece part carrier, comprising:
    a mandrel removably located in a support structure at a first plane;
    a pair of mechanical arms adapted to selectively grasp said mandrel at both ends and move said mandrel to a load location at a second plane;
    a plurality of bearing surfaces lying in the second plane along a common axis at the load location for removably receiving said mandrel;
    a third mechanical arm for selectively grasping one end of said mandrel for moving it along the common axis of the plurality of bearing surfaces; and
    means for simultaneously moving a plurality of piece parts into a position intersecting the plane of the bearing surfaces at their common axis;
    whereby said mandrel is moved by said third mechanical arm to engage each of the piece parts for loading.

2. The loading and unloading apparatus of claim 1 wherein said mandrel comprises a shaft having a predetermined length with a gear fixedly attached to one end.

3. The loading and unloading apparatus of claim 2 wherein said plurality of bearing surfaces comprises a plurality of saddle seat bearings lying in a single plane along a common axis, said bearings sized to receive the diametric shaft of said mandrel.

4. The loading and unloading apparatus of claim 3 wherein said third mechanical arm moves in a path parallel to the common axis of the bearings and grasps said mandrel by the gear fixedly attached to one end.

5. The loading and unloading apparatus of claim 4 wherein said pair of mechanical arms pivot about a common axis and move said mandrel in an arcuate path.

6. The loading and unloading apparatus of claim 5 wherein said piece parts to be loaded comprise metallic disks each having an aperture at geometric center and the shaft of said mandrel contains a plurality of circular grooves therein, one for each disk.

7. The loading and unloading apparatus of claim 6 further comprising baskets containing a plurality of said metallic disks carried on edge in spaced apart relation with their center apertures aligned along a common axis, the baskets being moved to a location where the common axis of the disk apertures lie on the axis of the mandrel shaft when located on the plurality of saddle seat bearings.

8. The loading and unloading apparatus of claim 7 wherein said moving means comprises means for lifting said baskets.

9. The loading and unloading apparatus of claim 8 further comprising means to ensure each disk in a basket is located on edge therein when the basket is raised.

10. The loading and unloading apparatus of claim 9 whereby said mandrel engages each disk in a basket by sliding its shaft through the center aperture thereof, as it moves along the common axis of the saddle seat bearings, each disk coming to rest in a respective circular groove on the mandrel shaft, when the basket is lowered relative to the mandrel.

11. A loading and unloading apparatus for moving a plurality of disks from a conveyor mechanism to a rack mechanism removably engaging the loading and unloading apparatus, comprising:
    a pair of mechanical arms, adapted for selectively grasping, moveable in a defined path, one extreme of the defined path intersecting the rack mechanism in a first plane along a common axis;

a linear bearing surface along a common axis in a second plane at the other extreme of the defined path of movement of said pair of mechanical arms;

a mandrel located between said pair of mechanical arms and selectively grasped thereby for movement between one extreme of the path of travel to the other extreme; and a single mechanical arm located at, and moveable along a path parallel to the common axis of the linear bearing surface in the second plane for receiving said mandrel from said pair of mechanical arms and moving it along the common axis of the linear bearing surface in said second plane;

whereby said mandrel picks up and moves a plurality of disks from the conveyor mechanism to the rack mechanism.

* * * * *